United States Patent
Nakagawa et al.

(10) Patent No.: US 10,209,619 B2
(45) Date of Patent: Feb. 19, 2019

(54) COMPOSITION AND METHOD OF FORMING PATTERN USING COMPOSITION

(71) Applicant: JSR CORPORATION, Tokyo (JP)

(72) Inventors: Hisashi Nakagawa, Tokyo (JP); Ryuichi Saitou, Tokyo (JP); Shunsuke Kurita, Tokyo (JP); Tatsuya Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 30 days.

(21) Appl. No.: 15/235,471

(22) Filed: Aug. 12, 2016

(65) Prior Publication Data

US 2016/0349616 A1    Dec. 1, 2016

Related U.S. Application Data

(63) Continuation of application No. PCT/JP2015/056190, filed on Mar. 3, 2015.

(30) Foreign Application Priority Data

Mar. 12, 2014    (JP) .................................. 2014-049152

(51) Int. Cl.
| H01L 21/311 | (2006.01) |
| G03F 7/11 | (2006.01) |
| G03F 7/09 | (2006.01) |
| H01L 21/033 | (2006.01) |

(52) U.S. Cl.
CPC ............... *G03F 7/11* (2013.01); *G03F 7/091* (2013.01); *G03F 7/094* (2013.01); *H01L 21/0332* (2013.01); *H01L 21/0337* (2013.01); *H01L 21/31144* (2013.01); *H01L 21/31116* (2013.01); *H01L 21/31138* (2013.01)

(58) Field of Classification Search
CPC . G03F 7/11; G03F 7/091; G03F 7/094; H01L 21/0332; H01L 21/0337
USPC ....................................................... 438/703
See application file for complete search history.

(56) References Cited

U.S. PATENT DOCUMENTS

| 5,061,599 A | 10/1991 | Kudo et al. | |
| 2003/0213614 A1* | 11/2003 | Furusawa | H01L 21/288 174/256 |
| 2003/0235786 A1 | 12/2003 | Krishnamurthy et al. | |
| 2005/0098777 A1* | 5/2005 | Kirchmeyer | C07D 333/08 257/40 |
| 2005/0250051 A1* | 11/2005 | Kim | G03F 7/0042 430/322 |
| 2006/0263614 A1* | 11/2006 | Andolfatto | C23C 18/04 428/469 |
| 2008/0026576 A1* | 1/2008 | Shenai-Khatkhate | C07F 1/08 438/680 |
| 2008/0146802 A1* | 6/2008 | Lee | B82Y 10/00 546/2 |
| 2010/0086870 A1 | 4/2010 | Ogihara et al. | |
| 2013/0260283 A1* | 10/2013 | Valle | C04B 35/62231 429/492 |
| 2015/0221879 A1* | 8/2015 | Inoue | C07F 15/0033 257/40 |

FOREIGN PATENT DOCUMENTS

| JP | 63-216042 A | 9/1988 |
| JP | 02-141755 A | 5/1990 |
| JP | 2001-284209 A | 10/2001 |
| JP | 2005-537502 A | 12/2005 |
| JP | 2008-39811 A | 2/2008 |
| JP | 2010-85912 A | 4/2010 |
| TW | 201319219 A1 | 5/2013 |

OTHER PUBLICATIONS

International Search Report dated Jun. 2, 2015, in PCT/JP2015/056190 filed Mar. 3, 2015 (w/ English translation).
Office Action dated Aug. 7, 2018, in Taiwan Patent Application No. 104107740 (w/ English translation).

* cited by examiner

*Primary Examiner* — Caleb Henry
(74) *Attorney, Agent, or Firm* — Oblon, McClelland, Maier & Neustadt, L.L.P.

(57) ABSTRACT

A semiconductor device production composition comprises a product obtained by mixing a metal compound and a compound represented by Formula (1) in a first organic solvent, and a second organic solvent. R and R' each independently represent a hydrogen atom, a linear or cyclic alkyl group having a carbon number of 2 to 20, a linear or cyclic alkylcarbonyl group having a carbon number of 2 to 20, an aryl group having a carbon number of 6 to 20, or an aryloxy group having a carbon number of 6 to 20, and part of the hydrogen atoms in the cyclic alkyl, cyclic alkylcarbonyl, aryl, or aryloxy group are substituted or unsubstituted.

$$R-O-O-R' \qquad (1)$$

14 Claims, No Drawings

COMPOSITION AND METHOD OF FORMING PATTERN USING COMPOSITION

CROSS-REFERENCE TO RELATED APPLICATIONS

The present application is a continuation application of International Application No. PCT/JP2015/056190, filed Mar. 3, 2015, which claims priority to Japanese Patent Application No. 2014-049152, filed Mar. 12, 2014. The contents of these applications are incorporated herein by reference in their entirety.

BACKGROUND OF THE INVENTION

Field of the Invention

The present invention relates to a semiconductor device production composition and a pattern formation method.

Discussion of the Background

Photolithography technologies of forming a resist pattern using a photoresist composition have been in practice for example in the field of microfabrication for production of integrated circuit elements and others. Specifically, a resist film is formed on a substrate with a photoresist composition and a short-wavelength radiation ray such as KrF excimer laser (wavelength: 248 nm) or ArF excimer laser (wavelength: 193 nm) is irradiated to the resist film through a mask pattern, forming a resist pattern consisting of exposed and non-exposed regions.

Recently under the trend toward reduction in size of semiconductor devices and others, reduction in processing size is in progress for higher integration density, using multilayer resist process. In the multilayer resist process, a coated film is formed on a substrate, using a semiconductor device production composition (for example, inorganic film-forming composition); a resist pattern is formed on the coated film, using an organic material different in etching speed from the coated film; the resist pattern is then transferred to the inorganic film by dry etching and it is further transferred to the substrate by dry etching, to give a substrate carrying a desired pattern (see, e.g., JP-A No. 2001-284209, JP-A No. 2010-85912, JP-A No. 2008-39811).

Recently, in addition to compositions containing a silicon-based compound, metal compound-containing compositions that give a higher etching selectivity to the silicon dioxide film that is formed next to the coated film and an resist lower-layer film (which is an organic film) have been studied as the semiconductor device production compositions (see JP-T No. 2005-537502).

In addition to the reduction in size described above, devices such as integrated circuit elements are becoming more and more sophisticated and thus, methods of forming a pattern by the multilayer resist process on a substrate patterned for example with wiring grooves (trenches) and plug grooves (via holes) and method of forming a complicated pattern by forming patterns multiple times are in practice.

SUMMARY OF THE INVENTION

According to one aspect of the present invention, a semiconductor device production composition comprises a product obtained by mixing a metal compound and a compound represented by Formula (1) in a first organic solvent, and a second organic solvent.

In Formula (1), R and R' each independently represent a hydrogen atom, a linear or cyclic alkyl group having a carbon number of 2 to 20, a linear or cyclic alkylcarbonyl group having a carbon number of 2 to 20, an aryl group having a carbon number of 6 to 20, or an aryloxy group having a carbon number of 6 to 20, and part of the hydrogen atoms in the cyclic alkyl, cyclic alkylcarbonyl, aryl, or aryloxy group are unsubstituted or substituted with substituent groups.

According to another aspect of the present invention, a pattern formation method, comprises applying the semiconductor device production composition onto a top face of a substrate to form a coated film on the top face of the substrate. A resist pattern is formed on a top face of the coated film. A pattern is formed on the substrate by dry-etching the coated film one or more times, using the resist pattern as a mask.

DESCRIPTION OF THE EMBODIMENTS

The embodiment of the present invention provides first, a semiconductor device production composition, comprising a product obtained by mixing a metal compound and a compound represented by the following Chemical Formula (1) in an organic solvent [I], and an organic solvent [II]:

$$R\text{—}O\text{—}O\text{—}R' \tag{1}$$

(in Formula (1), R and R' each independently represent a hydrogen atom, a linear or cyclic alkyl group having a carbon number of 2 to 20, a linear or cyclic alkylcarbonyl group having a carbon number of 2 to 20, an aryl group having a carbon number of 6 to 20, or an aryloxy group having a carbon number of 6 to 20 and part of the hydrogen atoms in the cyclic alkyl, cyclic alkylcarbonyl, aryl, or aryloxy group may be substituted with substituent groups.)

The semiconductor device production composition according to the embodiment of the present invention contains a product prepared in reaction of a metal compound with a compound represented by Chemical Formula (1) above in an organic solvent [I]. The product is characteristic in that it shows volume expansion when thermally cross-linked.

The product contained in the semiconductor device production composition according to the embodiment of the present invention can be prepared by mixing additionally a compound represented by the following Chemical Formula (2):

$$R'\text{-(}X)_n \tag{2}$$

(in Formula (2), R' represents a n-valent organic group; X represents —OH, —COOH, —NCO, or —NR$^a$R$^b$; R$^a$ and R$^b$ each independently represent a hydrogen atom or a monovalent organic group; n is an integer of 2 to 4; The multiple groups X may be the same as or different from each other.)

The metal compound used in the semiconductor device production composition according to the embodiment of the present invention is, for example, a metal compound represented by following Chemical Formula (3):

$$[\text{M La Xb}] \tag{3}$$

(in Formula (3), M represents a titanium atom, an aluminum atom, a zirconium atom, a tantalum atom, or a tungsten atom; L represents a multidentate ligand; a is an integer of 1 to 3; when a is 2 or more, the multiple groups L may be the same as or different from each other; X represents a halogen ligand, a hydroxo ligand, a carboxy ligand, an alkoxy ligand, a carboxylate ligand, or an amide ligand; b is an integer of 2 to 6; the multiple groups X may be the same as or different from each other; however, a+b is 7 or less.)

R and R' in Formula (1) above may be respectively hydrogen atoms.

The semiconductor device production composition according to the embodiment of the present invention may additionally comprise water and, in this case, the weight of the organic solvent [II] may be adjusted to be larger than that of the water.

In the semiconductor device production composition according to the embodiment of the present invention, the organic solvent [I] used may be the same as the organic solvent [II].

The semiconductor device production composition according to the embodiment of the present invention can be used in the multilayer resist process.

The embodiment of the present invention additionally provides a pattern formation method comprising:
(1) a step of applying the semiconductor device production composition according to the embodiment of the present invention onto the top face of a substrate;
(2) a step of forming a resist pattern on the top face of the coated film; and
(3) a step of forming a pattern on the substrate by dry-etching the coated film once or multiple times, using the resist pattern as mask.

The resist-patterning step (2) in the pattern formation method according to the embodiment of the present invention may comprise a step of laminating an antireflective film on the coated film and a step of forming a resist pattern on the antireflective film laminated.

The pattern formation method according to the embodiment of the present invention may additionally comprise (0) a step of forming a resist lower-layer film on the substrate and, in such a case, the semiconductor device production composition may be applied on the resist lower-layer film in the application step (1).

The semiconductor device production composition according to the embodiment of the present invention is superior in embeddability into a pattern wafer and additionally permits reduction of film stress during patterning in the multilayer resist process.

A coated film which is formed by applying the semiconductor device production composition of the embodiment of the present invention on a substrate and by heating the coated product does not largely shrink during curing by heat treatment. Because the amount of the shrinkage, so-called film stress, is not large, it does not lead, for example, to cracking, exfoliation, deformation, voids (expansion) of the film or bending of the substrate, resulting, for example, in displacement of the focal point in the light exposure step and reduction in yield. The advantageous effects described above are not restricted at all and may be any of those described in the present technology.

Hereinafter, favorable embodiments of the invention will be described in detail. However, it should be understood that the embodiments described below are only typical embodiments of the present invention and the present invention is not limited to the embodiments below.

<Semiconductor Device Production Composition>

The semiconductor device production composition according to the embodiment of the present invention comprises a product obtained by mixing a metal compound and a compound represented by Chemical Formula (1) above in an organic solvent [I] (hereinafter, referred to as "product [A]") and an organic solvent [II] (hereinafter, referred to as "organic solvent [B]"). It may additionally comprise, as needed, a crosslinking accelerator [C] and other components in the ranges that do not impair the advantageous effects of the present invention.

Hereinafter, each component will be described in detail.
[Product [A]]

The product [A] is a product obtained by mixing a metal compound and a compound represented by Chemical Formula (1) above in an organic solvent [I]. More specifically, the product [A] is a product obtained by reacting a metal compound with hydrogen peroxide in an organic solvent [I]. In addition, a compound represented by Chemical Formula (2) above (hereinafter, referred to as "compound (2)") may be mixed, as needed, in preparation of the product.
[Organic Solvent [I]]

The organic solvent [I] usable in preparation of the product [A] may be any known organic solvent that can be used in semiconductor device production compositions, if it does not impair the advantageous effects of the present invention, and these organic solvents may be used alone or in combination of two or more, as arbitrarily selected. Examples thereof include alcohol-based solvents, ketone-based solvents, amide-based solvents, ether-based solvents, ester-based solvents, hydrocarbon-based solvents, and the like.

Typical examples of the alcohol-based solvents include monovalent aliphatic alcohols such as methanol, ethanol, n-propanol, iso-propanol, n-butanol, iso-butanol, sec-butanol, tert-butanol, n-pentanol, iso-amyl alcohol, 2-methylbutanol, sec-pentanol, tert-pentanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, and sec-heptadecyl alcohol;

monovalent alicyclic alcohols such as cyclohexanol, methylcyclohexanol, and 3,3,5-trimethylcyclohexanol;

aromatic alcohols such as benzyl alcohol and phenethyl alcohol;

monovalent ether or keto group-containing alcohols such as 3-methoxybutanol, furfuryl alcohol, and diacetone alcohol;

polyvalent alcohols such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol;

alkylene glycol monoalkyl ethers such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monomethyl ether, propylene glycol monoethyl ether, propylene glycol monopropyl ether, and propylene glycol monobutyl ether;

ether group-containing alkylene glycol monoalkyl ethers such as diethylone glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, and dipropylene glycol monopropyl ether; and the like.

Typical examples of the ketone-based solvents include linear ketones such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, diiso-butyl ketone, and trimethylnonanone;
cyclic ketones such as cyclopentanone, cyclohexanone, cycloheptanone, cyclooctanone, and methylcyclohexanone;
aromatic ketones such as acetophenone and phenyl ethyl ketone;
γ-diketones such as acetonylacetone; and the like.

Typical examples of the amide-based solvents include linear amides such as N-methylformamide, N,N-dimethylformamide, N,N-diethylformamide, acetamide, N-methylacetamide, N,N-dimethylacetamide, and N-methylpropionamide;
cyclic amides such as N-methylpyrrolidone, and N,N'-dimethylimidazolidinone; and the like.

Typical examples of the ether-based solvents include dialiphatic ethers such as diethyl ether and dipropyl ether;
aromatic aliphatic ethers such as anisole and phenyl ethyl ether;
diaromatic ethers such as diphenyl ether;
cyclic ethers such as tetrahydrofuran, tetrahydropyran, and dioxane; and the like.

Typical examples of the ester-based solvents include monocarboxylic esters such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetato, methylcyclohexyl acetate, n-nonyl acetate, ethyl propionate, n-butyl propionate, iso-amyl propionate, methyl acetoacetate, and ethyl acetoacetate;
dicarboxylic esters such as diethyl oxalate, di-n-butyl oxalate, diethyl malonate, dimethyl phthalate, and diethyl phthalate;
carboxylic esters of alkylene glycol monoalkyl ethers such as ethylene glycol monomethyl ether acetate, ethylene glycol monoethyl ether acetate, ethylene glycol monopropyl ether acetate, propylene glycol monomethyl ether acetate, propylene glycol monoethyl ether acetate, propylene glycol monopropyl ether acetate, propylene glycol monobutyl ether acetate, and propylene glycol monomethyl ether propionate;
carboxylic esters of ether group-containing alkylene glycol monoalkyl ethers such as diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, and diethylene glycol monomethyl ether propionate;
hydroxy acid esters such as methyl glycolate, ethyl glycolate, methyl lactate, ethyl lactate, n-butyl lactate, and n-amyl lactate;
lactones such as γ-butylolactone and γ-valerolactone;
carbonates such as diethyl carbonate and propylene carbonate; and the like.

Among the solvents above, the organic solvent [I] is preferably an alcohol-based solvent, an ether-based solvent, an ester-based solvent, or a hydrocarbon-based solvent; more preferably a monovalent aliphatic alcohol, an alkylene glycol monoalkyl ether, a hydroxy acid ester, an alkylene glycol monoalkyl ether carboxylate ester, a lactone, a cyclic ether, or an aromatic hydrocarbon; still more preferably, a monovalent aliphatic alcohol having a carbon number of 2 or more, an alkylene glycol monoalkyl ether having a carbon number of 6 or more, a hydroxy acid ester having a carbon number of 4 or more, an alkylene glycol monoalkyl ether carboxylic ester having a carbon number of 6 or more, a lactone having a carbon number of 4 or more, a cyclic ether having a carbon number of 4 or more, or an aromatic hydrocarbon having a carbon number of 7 or more; particularly preferably ethanol, n-butanol, propylene glycol monomethyl ether, propylene glycol monoethyl ether, propylene glycol monopropyl ether, ethyl lactate, propylene glycol monomethyl ether acetate, γ-butylolactone, tetrahydrofuran, or toluene.

After reaction, the organic solvent [I] may be used, as it is without removal, as the organic solvent [B] for the semiconductor device production composition (organic solvent [II]).

[Metal Compound]

The metal compound usable in preparation of the product [A] may be any metal compound usable in preparation of semiconductor device production compositions, if it does not impair the advantageous effects of the present invention, and these metal compounds may be used alone or in combination of two or more, as arbitrarily selected. Examples thereof include metal compounds represented by Chemical Formula (3) above.

In Chemical Formula (3) above, the multidentate ligand indicated by L can be used for improvement in solubility of the metal compound in the cleaning solvent for the semiconductor device production composition. The kind of the multidentate ligand usable in the metal compound is not particularly limited and multidentate ligands usable in the metal compound in the semiconductor device production composition can be used alone or in combination of two or more, as arbitrarily selected.

In the embodiment of the present invention, the multidentate ligand is preferably a ligand derived from at least one compound selected from the group consisting of hydroxy acid esters, ß-diketones, ß-ketoesters, ß-dicarboxylic esters, and n bond-containing hydrocarbons. It is possible by using such a ligand as the multidentate ligand to improve the efficiency of removing the cleaning solvent from the semiconductor device production composition. These compounds form a multidentate ligand, normally as an anion carrying one electron or as it is in its structure.

The hydroxy acid ester is not particularly limited, if it is a hydroxy group-containing carboxylic ester, and examples thereof include compounds represented by Chemical Formula (4) below and the like.

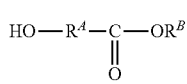

(4)

In Chemical Formula (4) above, $R^A$ represents a bivalent organic group having a carbon number of 1 to 20. $R^B$ represents a monovalent organic group having a carbon number of 1 to 20.

Examples of the bivalent organic groups indicated by $R^A$ include monovalent hydrocarbon groups having a bivalent carbon number of 1 to 20, groups (a) having a bivalent heteroatom-containing group between the carbon-carbon bond or at the binding site-sided terminal of the hydrocarbon group above, those hydrocarbon groups and groups (a) wherein part or all of the hydrogen atoms therein are replaced with monovalent heteroatom-containing groups, and the like.

Examples of the heteroatoms in the monovalent or bivalent heteroatom-containing group include oxygen atom, nitrogen atom, sulfur atom, silicon atom, phosphorus atom, and the like.

Examples of the bivalent heteroatom-containing groups include —O—, —S—, —CO—, —CS—, —NR'—, groups in combination thereof, and the like. R' represents a hydrogen atom or a monovalent hydrocarbon group having a carbon number of 1 to 10.

Examples of the monovalent heteroatom-containing groups include hydroxy group, sulfanyl group (—SH), amino group, cyano group, carboxy group, keto group (=O), and the like.

Examples of the monovalent organic groups indicated by $R^B$ include the groups exemplified as the bivalent organic group $R^A$ above to which a hydrogen atom is added, and the like.

$R^A$ above is preferably a bivalent hydrocarbon group, more preferably an alkanediyl group, a cycloalkanediyl group, or an arenediyl group, still more preferably a methanediyl group, an ethanediyl group, a cyclohexanediyl group, or a benzenediyl group, particularly preferably an ethanediyl group.

$R^B$ above is preferably a monovalent hydrocarbon group, more preferably an alkyl group, still more preferably a methyl group, an ethyl group, a propyl group, or a butyl group, particularly preferably an ethyl group.

Examples of the hydroxy acid esters include glycolic esters, lactic esters, 2-hydroxycyclohexane-1-carboxylic esters, salicylic esters, and the like. Among the compounds above, lactic esters are preferable and ethyl lactate is more preferable.

The ß-diketone above is not particularly limited if it is a compound having a 1,3-diketo structure, and examples thereof include compounds represented by the following Chemical Formula (5) and the like.

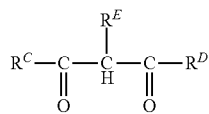

(5)

In Chemical Formula (5) above, $R^C$ and $R^D$ each independently represent a monovalent organic group having a carbon number of 1 to 20. $R^E$ represents a hydrogen atom or a monovalent organic group having a carbon number of 1 to 20.

Examples of the monovalent organic group having a carbon number of 1 to 20 indicated by $R^C$, $R^D$, or $R^E$ above include groups similar to those exemplified as the monovalent organic group $R^B$ in Formula (3) above and the like.

$R^C$ and $R^D$ above are preferably a monovalent hydrocarbon group, more preferably an alkyl group, still more preferably a methyl group, an ethyl group, a propyl group, or a butyl group, particularly preferably a methyl group.

$R^E$ above is preferably a hydrogen atom or a monovalent hydrocarbon group, more preferably a hydrogen atom or an alkyl group, still more preferably a hydrogen atom or a methyl group, particularly preferably a hydrogen atom.

Examples of the β-diketones include acetylacetone, methyl acetylacetone, ethyl acetylacetone, and the like. Among the compounds above, acetylacetone is preferable.

The β-ketoester above is not particularly limited if it is a compound having a ketone carbonyl group at the β site of the carboxylic ester, and examples thereof include compounds represented by the following Chemical Formula (6) and the like.

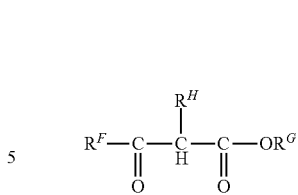

(6)

In Chemical Formula (6) above, $R^F$ and $R^G$ each independently represent a monovalent organic group having a carbon number of 1 to 20. $R^H$ represents a hydrogen atom or a monovalent organic group having a carbon number of 1 to 20.

Examples of the monovalent organic groups having a carbon number of 1 to 20 represented by $R^F$, $R^G$, or $R^H$ above include groups similar to those exemplified as the monovalent organic groups of $R^B$ in Formula (3) above and the like.

$R^F$ above is preferably a monovalent hydrocarbon group or a carbonyloxyhydrocarbon group-substituted hydrocarbon group, more preferably an alkyl group, an aryl group, or an alkoxycarbonylalkyl group, still more preferably a methyl group, a phenyl group, or a methoxycarbonylmethyl group, particularly preferably a methyl group.

$R^G$ above is preferably a monovalent hydrocarbon group, more preferably an alkyl group, still more preferably a methyl group, an ethyl group, a propyl group, or a butyl group, particularly preferably an ethyl group.

$R^H$ above is preferably a hydrogen atom or a monovalent hydrocarbon group, more preferably a hydrogen atom or an alkyl group, still more preferably a hydrogen atom or a methyl group, particularly preferably a hydrogen atom.

Examples of the ß-ketoesters include acetoacetic esters, α-alkyl-substituted acetoacetic esters, ß-ketopentanoic esters, benzoylacetic esters, 1,3-acetonedicarboxylic acid esters, and the like. Among the compounds above, acetoacetic esters are preferable and ethyl acetoacetate is more preferable.

Examples of the ß-dicarboxylic esters include compounds represented by the following Chemical Formula (7) and the like.

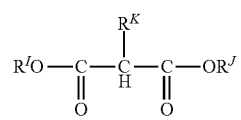

(7)

In Chemical Formula (7) above, $R^I$ and $R^J$ each independently represent a monovalent organic group having a carbon number of 1 to 20. $R^K$ represents a hydrogen atom or a monovalent organic group having a carbon number of 1 to 20.

Examples of the monovalent organic groups having a carbon number of 1 to 20 represented by $R^I$, $R^J$, or $R^K$ above include groups similar to those exemplified as the monovalent organic groups of $R^B$ in Formula (3) above and the like.

$R^I$ and $R^J$ above each are preferably a monovalent hydrocarbon group, more preferably an alkyl group, still more preferably a methyl group, an ethyl group, a propyl group or a butyl group, particularly preferably an ethyl group.

$R^K$ above is preferably a hydrogen atom or a monovalent hydrocarbon group, more preferably a hydrogen atom, an alkyl group, a cycloalkyl group, or an aryl group, still more preferably a hydrogen atom or an alkyl group, particularly preferably a hydrogen atom.

Examples of the ß-dicarboxylic acid esters include malonic diesters, α-alkyl-substituted malonic diesters, α-cycloalkyl-substituted malonic diesters, α-aryl-substituted malonic diesters, and the like. Among the compounds above, malonic diesters are preferable and diethyl malonate is more preferable.

Examples of the π-bond-containing hydrocarbons include linear olefins such as ethylene and propylene; cyclic olefins such as cyclopentene, cyclohexene, and norbornene; linear dienes such as butadiene and isoprene; cyclic dienes such as cyclopentadiene, methylcyclopentadiene, pentamethylcyclopentadiene, cyclohexadiene, and norbornadiene; aromatic hydrocarbons such as benzene, toluene, xylene, hexamethylbenzene, naphthalene, and indene; and the like.

Among the compounds above, cyclic dienes are preferable and cyclopentadiene is more preferable. Cyclopentadiene normally forms a multidentate ligand cyclopentadienyl anion, as it receives one electron.

The number of the multidentate ligands that coordinate the metal atom ("a" in Chemical Formula (3) above) is 1 to 3, preferably 1 or 2, more preferably 1 to one metal atom. The number of the multidentate ligands is the average value to one metal atom.

Examples of the halogen ligands represented by X in Chemical Formula (3) above include fluorine, chlorine, bromine, and iodine ligands and the like. Among the ligands above, a chlorine ligand is preferable.

Examples of the alkoxy ligands represented by X above include a methoxy ligand (OMe), an ethoxy ligand (OEt), a n-propoxy ligand (nOPr), an i-propoxy ligand (iOPr), an n-butoxy ligand (nOBu), and the like. Among the ligands above, ethoxy, i-propoxy, and n-butoxy ligands are preferable.

Examples of the carboxylate ligands represented by X above include a formate ligand (OOCH), an acetate ligand (OOCMe), a propionate ligand (OOCEt), a butyrate ligand (OOCPr), and the like. Among the ligands above, an acetate ligand is preferable.

Examples of the amide ligands represented by X above include an unsubstituted amide ligand ($NH_2$), a methylamide ligand (NHMe), a dimethylamide ligand ($NMe_2$), a diethylamide ligand ($NEt_2$), a dipropylamide ligand ($NPr_2$), and the like. Among the ligands above, dimethylamide and diethylamide ligands are preferable.

In Chemical Formula (3) above, b is an integer of 2 to 6, preferably an integer of 2 to 4, more preferably 2 or 3, particularly preferably 2. It is possible, when b is 2, to make the product [A] formed have a more linear structure and, as a result, to improve the anti-cleaning solvent stability of the semiconductor device production composition.

[Organic Peroxide]

The organic peroxide usable for preparation of the product [A] may be any organic peroxide that can be used in preparation of semiconductor device production compositions if it does not impair the advantageous effects of the present invention, and these organic peroxides may be used alone or in combination of two or more, as arbitrarily selected. The organic peroxide can be a compound represented by Chemical Formula (1).

In Formula (1) above, R and R' each independently represent a hydrogen atom, a linear or cyclic alkyl group having a carbon number of 2 to 20, a linear or cyclic alkylcarbonyl group having a carbon number of 2 to 20, an aryl group having a carbon number of 6 to 20, or an aryloxy group having a carbon number of 6 to 20. Part of the hydrogen atoms in the cyclic alkyl, cyclic alkylcarbonyl, aryl, or aryloxy group may be substituted with substituent groups.

Examples of the substituent groups include a hydroxyl group, a cyano group, linear alkyl groups having a carbon number of 1 to 10, cycloalkyl groups having a carbon number of 3 to 10, aryl groups having a carbon number of 6 to 10, and the groups in combination thereof.

Examples of the compounds represented by Formula 00 include hydrogen peroxide, peracetic acid, diisobutyryl peroxide, 1,1,3,3-tetramethylbutylperoxy-2-ethyl hexanoate, dilauroyl peroxide, di(3,5,5-trimethylhexanoyl) peroxide, t-butyl peroxypivalate, t-hexyl peroxypivalate, t-butyl peroxyneoheptanoate, t-butyl peroxyneodocanoate, t-hexyl peroxyneodecanoate, di(2-ethylhexyl) peroxydicarbonate, di(4-t-butylcyclohexyl) peroxydicarbonate, 1,1,3,3-tetramethylbutyl peroxyneodecanoate, di-sec-butyl peroxydicarbonate, di-n-propyl peroxydicarbonate, cumyl peroxyneodecanoate, methyl ethyl ketone peroxide, benzoyl peroxide, meta-chloroperbenzoic acid, and the like.

Among the compounds above, hydrogen peroxide is preferable.

[Compound Represented by Chemical Formula (2)]

For preparation of the product [A], it is preferable to mix the compound represented by Chemical Formula (2) (hereinafter, also referred to as "compound (2)").

Although accurate operational advantage of the compound (2) is not clear, it is considered to have a function to increase the solubility of the reaction product in the organic solvent [I], as it reacts with the complex obtained when the metal compound and the organic peroxide are mixed in the organic solvent. It is considered that it also functions as a crosslink ligand that crosslinks the metal atoms of the metal compound, as it coordinates the metal atoms. Thus, it is possible, if the compound (2) is present when the metal compound and hydrogen peroxide are mixed in the organic solvent [I], to improve the reactivity of the metal compound by suppressing precipitation of the complex and to form a binuclear complex derived from the metal compound. The compound (2) can function as a crosslink ligand as it is, or as a crosslink ligand in the anionic state as a proton is removed from the compound (2).

Examples of the n-valent organic groups represented by $R^1$ in Chemical Formula (2) above include n-valent hydrocarbon groups, n-valent heteroatom-containing groups having one or more heteroatom-containing groups between the carbon-carbon of the hydrocarbon groups above, those n-valent hydrocarbon groups and heteroatom-containing groups wherein part or all of the hydrogen atoms are substituted with substituent groups, and the like.

Examples of the n-valent hydrocarbon groups include groups that are formed by removing n hydrogen atoms from hydrocarbons including linear hydrocarbons having a carbon number of 1 to 30 (e.g., alkanes such as methane, ethane, propane, and butane; alkenes such as ethene, propene, butene, and pentene; and alkynes such as ethyne, propyne, butyne, and pentyne); alicyclic hydrocarbons having a carbon number of 3 to 30 (e.g., cycloalkanes such as cyclopropane, cyclobutane, cyclopentane, cyclohexane, norbornane, and adamantane; and cycloalkenes such as cyclopropene, cyclobutene, cyclopentene, cyclohexene, and norbornene); aromatic hydrocarbons having a carbon number of 6 to 30 (e.g., arenes such as benzene, toluene, xylene, mesitylene, naphthalene, methylnaphthalene, dimethylnaphthalene, and anthracene); and the like.

Examples of the heteroatom-containing groups include groups containing at least one atom selected from the group consisting of oxygen, nitrogen, silicon, phosphorus, and sulfur and typical examples thereof include —O—, —NH—, —CO—, —S—, groups in combination thereof, and the like. Among the groups above, —O— is preferable.

Examples of the substituent groups include halogen atoms such as fluorine, chlorine, bromine, and iodine;

alkoxy groups such as methoxy, ethoxy, and propoxy;

alkoxycarbonyl groups such as methoxycarbonyl and ethoxycarbonyl;

alkoxycarbonyloxy groups such as methoxycarbonyloxy and ethoxycarbonyloxy;

acyl groups such as formyl, acetyl, propionyl, butyryl, and benzoyl;

a cyano group, a nitro group, and the like.

n is preferably 2 to 4, more preferably 2 or 3.

Examples of the monovalent organic groups represented by $R^a$ and $R^b$ of —$NR^aR^b$ in X of Formula (2) above include a hydrogen atom, monovalent hydrocarbon groups having a carbon number of 1 to 20, heteroatom-containing groups having a heteroatom-containing group between the carbon-carbon of the hydrocarbon groups above, those hydrocarbon and heteroatom-containing groups wherein part or all of the hydrogen atoms are substituted with substituent groups, and the like. $R^a$ and $R^b$ each are preferably a monovalent hydrocarbon group, more preferably a monovalent linear hydrocarbon group, still more preferably an alkyl group, particularly preferably a methyl group.

When n is 2, $R^1$ is preferably a bivalent linear hydrocarbon group, a bivalent aromatic hydrocarbon group, or a bivalent heteroatom-containing group, more preferably an alkanediyl group, an alkenediyl group, an arenediyl group, or an alkanediyloxyalkanediyl group, still more preferably a 1,1-ethanediyl group, a 1,2-ethanediyl group, a 1,2-propanediyl group, a butanediyl group, a hexanediyl group, an ethenediyl group, a xylenediyl group, or an ethanediyloxyethanediyl group.

Alternatively when n is 3, it is preferably a trivalent linear hydrocarbon group, more preferably an alkanetriyl group, still more preferably 1,2,3-propanetriyl group.

Alternatively when n is 4, it is preferably a quadrivalent linear hydrocarbon group, more preferably an alkanetetrayl group, still more preferably a 1,2,2,3-propanetetrayl group, or a 1,2,3,4-butanetetrayl group.

Examples of the compounds (2) include compounds represented by the following Chemical Formula (8) (hereinafter, referred to as "compounds (8)") and the like.

(in Formula (8), X' represents —COOH, —NCO, or —$NR^aR^b$; $R^a$ and $R^b$ each independently represent a hydrogen atom or a monovalent organic group; n is an integer of 0 to 4; the groups X may be the same as or different from each other; and $R^1$ represents a n-valent organic group.)

In Formula (8) above, $R^1$, $R^a$, and $R^b$ are the same as those in Chemical Formula (2) above.

Examples of the compounds (8), when n is 2, include alkylene glycols such as ethylene glycol, propylene glycol, butylene glycol, and hexamethylene glycol;

dialkylene glycols such as diethylene glycol, dipropylene glycol, dibutylene glycol, triethylene glycol, and tripropylene glycol;

cycloalkylene glycols such as cyclohexanediol, cyclohexanedimethanol, norbornanediol, norbornanedimethanol, and adamantanediol;

aromatic ring-containing glycols such as 1,4-benzenedimethanol and 2,6-naphthalenedimethanol;

bivalent phenols such as catechol, resorcinol, and hydroquinone; and the like.

Examples thereof, when n is 3, include alkanetriols such as glycerol and 1,2,4-butanetriol;

cycloalkanetriols such as 1,2,4-cyclohexanetriol and 1,2,4-cyclohexane trimethanol;

aromatic ring-containing glycols such as 1,2,4-benzenetrimethanol and 2,3,6-naphthalenetrimethanol;

trivalent phenols such as pyrogallol and 2,3,6-naphthalenetriol; and the like.

Examples thereof, when n is 4, include alkane tetraols such as erythritol and pentaerythritol;

cycloalkane tetraols such as 1,2,4,5-cyclohexane tetraol;

aromatic ring-containing tetraols such as 1,2,4,5-benzenetetramethanol; tetravalent phenol such as 1,2,4,5-benzenetetraol; and the like.

Among the compounds above, those having a n value of 2 or 3 are preferable; alkylene glycols, dialkylene glycols, and alkanetriol are more preferable; and propylene glycol, diethylene glycol, and glycerol are still more preferable.

Examples of the compounds (8), wherein X' is —COOH, include linear saturated dicarboxylic acids such as oxalic acid, malonic acid, succinic acid, glutaric acid, and adipic acid;

linear unsaturated dicarboxylic acids such as maleic acid and fumaric acid;

alicyclic dicarboxylic acids such as 1,4-cyclohexanedicarboxylic acid, norbornanedicarboxylic acid, and adamantanedicarboxylic acid;

aromatic dicarboxylic acids such as phthalic acid, terephthalic acid, 2,6-naphthalenedicarboxylic acid, and 2,7-naphthalenedicarboxylic acid;

linear saturated tricarboxylic acids such as 1,2,3-propane tricarboxylic acid;

linear unsaturated tricarboxylic acids such as 1,2,3-propenetricarboxylic acid;

alicyclic tricarboxylic acids such as 1,2,4-cyclohexanetricarboxylic acid;

aromatic tricarboxylic acids such as trimellitic acid and 2,3,7-naphthalenetricarboxylic acid;

linear saturated tetracarboxylic acids such as 1,2,3,4-butanetetracarboxylic acid;

linear unsaturated tetracarboxylic acids such as 1,2,3,4-butadienetetracarboxylic acid;

alicyclic tetracarboxylic acids such as 1,2,5,6-cyclohexanetetracarboxylic acid and 2,3,5,6-norbornanetetracarboxylic acid;

aromatic tetracarboxylic acids such as pyromellitic acid and 2,3,6,7-naphthalenetetracarboxylic acid; and the like.

Among the compounds above, linear saturated dicarboxylic acids, linear unsaturated dicarboxylic acids, alicyclic dicarboxylic acids, and aromatic dicarboxylic acids are preferable; linear saturated dicarboxylic acids and linear unsaturated dicarboxylic acids are more preferable; and maleic acid and succinic acid are still more preferable.

Examples of the compounds (8), wherein X' represents —NCO, include linear diisocyanates such as ethylene diisocyanate, trimethylene diisocyanate, tetramethylene diisocyanate, and hexamethylene diisocyanate;

alicyclic diisocyanates such as 1,4-cyclohexane diisocyanate and isophorone diisocyanate;

aromatic diisocyanates such as tolylene diisocyanate, 1,4-benzene diisocyanate, and 4,4'-diphenylmethane diisocyanate;

linear triisocyanates such as trimethylene triisocyanate;

alicyclic triisocyanates such as 1,2,4-cyclohexane triisocyanate;

aromatic triisocyanates such as 1,2,4-benzene triisocyanate;
linear tetraisocyanates such as tetramethylene tetraisocyanate;
alicyclic tetraisocyanates such as 1,2,4,5-cyclohexane tetraisocyanate;
aromatic tetraisocyanates such as 1,2,4,5-benzene tetraisocyanate; and the like.

Among the compounds above, linear diisocyanates, alicyclic diisocyanates, and aromatic diisocyanates are preferable, linear diisocyanates are more preferable, and hexamethylene diisocyanate is still more preferable.

Examples of the compound (8), wherein X' represents —NR$^a$R$^b$, include linear diamines such as ethylenediamine, N-methylethylenediamine,
N,N'-dimethylethylenediamine, trimethylenediamine,
N,N'-dimethyltrimethylenediamine, tetramethylenediamine, and
N,N'-dimethyltetramethylenediamine;
alicyclic diamines such as 1,4-cyclohexanediamine and 1,4-di(aminomethyl)cyclohexane;
aromatic diamines such as 1,4-diaminobenzene and 4,4'-diaminodiphenylmethane;
linear triamines such as triaminopropane and N,N',N''-trimethyltriaminopropane;
alicyclic triamines such as 1,2,4-triaminocyclohexane;
aromatic triamines such as 1,2,4-triaminobenzene;
linear tetramines such as tetraaminobutane;
alicyclic tetramines such as 1,2,4,5-tetraaminocyclohexane and 2,3,5,6-tetraaminonorbornane;
aromatic tetramines such as 1,2,4,5-tetraaminobenzene; and the like.

Among the compounds above, linear diamines, alicyclic diamines, and aromatic diamines are preferable; linear diamines are more preferable, and N,N'-dimethylethylenediamine is still more preferable.

A compound having multiple functional groups of compound (8) can be used as compound (2). Examples of the compounds having multiple functional groups include citric acid, glycolic acid, lactic acid, amino acids, triethanolamine, ethylenediaminediacetic acid, and the like.

[Method for Preparing Product [A]]

The product [A] can be prepared in reaction of the metal compound with the organic peroxide in the organic solvent [I]. The compound represented by Chemical Formula (2) is preferably mixed then. When the compound (2) is mixed, the order of the mixing is not particularly limited and the metal compound, the organic peroxide, and the compound (2) can be mixed in any order.

The reaction temperature is preferably 0° C. to 150° C., more preferably 10° C. to 120° C. The reaction period is preferably 30 minutes to 24 hours, more preferably 1 to 20 hours, still more preferably 2 to 15 hours.

[Organic Solvent [B] (Organic Solvent [II])]

The organic solvent [B] used may be any known organic solvent that can be used in semiconductor device production compositions if it can dissolve or disperse the product [A], and the such solvents may be used alone or in combination of two or more, as arbitrarily selected. Examples thereof include alcohol-based solvents, ketone-based solvents, amide-based solvents, ether-based solvents, ester-based solvents, hydrocarbon-based solvents, and the like. The organic solvent used for reaction in synthesis of the product [A] may be used, as it is without removal, as the organic solvent [B]. Typical examples of the organic solvents are not described here, as they are the same as the organic solvents [I] described above.

The content of the organic solvent [B] is a content that gives a semiconductor device production composition containing the product [A] at a concentration of normally, 0.1 mass % to 50 mass %, preferably 0.5 mass % to 30 mass %, more preferably 1 mass % to 15 mass %, still more preferably 2 mass % to 10 mass %. It is possible to improve the storage stability and coatability of the semiconductor device production composition according to the embodiment of the present invention by controlling the content of the product [A] in the range above.

The semiconductor device production composition according to the embodiment of the present invention may contain water. When water is contained in the composition, it is preferable to control the content of the organic solvent [B] so that the weight of the organic solvent [B] is not smaller than that of water. It is possible, by making the weight of the organic solvent [B] not smaller than that of water, to make the semiconductor device production composition favorably coatable on substrates.

[Crosslinking Accelerator [C]]

The semiconductor device production composition according to the embodiment of the present invention may additionally contain a crosslinking accelerator [C]. The crosslinking accelerator [C] is a compound that generates acid or base by light or heat. The semiconductor device production composition according to the embodiment of the present invention shows improved resist pattern-forming efficiency and etching selectivity when it additionally contains a crosslinking accelerator [C]. Examples of the crosslinking accelerators [C] include onium salt compounds, N-sulfonyloxyimide compounds, and the like. The crosslinking accelerator [C] is preferably a thermal crosslinking accelerator that generates acid or base by heat, particularly preferably an onium salt compound.

Examples of the onium salt compounds include sulfonium salts, tetrahydrothiophenium salts, iodonium salts, ammonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo [2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo [2.2.1]hept-2-yl-1,1,2,2-tetrafluoroethanesulfonate, triphenylsulfonium 1,1,2,2-tetrafluoro-6-(1-adamantane carbonyloxy)-hexane-1-sulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo [2.2.1]hept-2-yl-1,1,2,2-tetrafluoroethanesulfonate, 1-(6-n-butoxynaphthalen-2-yl) tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl) tetrahydrothiophenium perfluoro-n-octanesulfonate, 1-(6-n- butoxynaphthalen-2-yl)tetrahydrothiophenium 2-bicyclo[2.2.1] hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like.

Examples of the iodonium salts include diphenyliodonium trifluoromethanesulfonate, diphenyliodonium nonafluoro-n-butanesulfonate, diphenyliodonium perfluoro-n-octanesulfonate, diphenyliodonium 2-bicyclo [2.2.1]hept-2-yl-1,1,2,2-tetrafluoroethanesulfonate, bis(4-t-butylphenyl) iodonium trifluoromethanesulfonate, bis(4-t-butylphenyDiodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the ammonium salts include ammonium formate, ammonium maleate, ammonium fumarate, ammonium phthalate, ammonium malonate, ammonium succinate, ammonium tartrate, ammonium malate, ammonium lactate, ammonium citrate, ammonium acetate, ammonium propionate, ammonium butanoate, ammonium pentanoate, ammonium hexanoate, ammonium heptanoate, ammonium octanoate, ammonium nonanoate, ammonium decanoate, ammonium oxalate, ammonium adipat, ammonium 劫劫劫劫劫劫Ó劫 劫劫劫劫劫劫劫 劫劫劫劫Ó劫劫 劫劫劫劫劫劫劫 劫劫劫Ó劫劫 劫劫劫劫 ammonium linolate, ammonium linolenate, ammonium salicylate, ammonium benzenesulfonate, ammonium benzoate, ammonium p-aminobenzoate, ammonium p-toluenesulfonate, ammonium methanesulfonate, ammonium trifluoromethanesulfonate, ammonium trifluoroethanesulfonate, and the like. Other examples thereof include the ammonium salts above wherein the ammonium ion is substituted with methylammonium ion, dimethylammonium ion, trimethylammonium ion, tetramethylammonium ion, ethylammonium ion, diethylammonium ion, triethylammonium ion, tetraethylammonium ion, propylammonium ion, dipropylammonium ion, tripropylammonium ion, tetrapropylammonium ion, butylammonium ion, dibutylammonium ion, tributylammonium ion, tetrabutylammonium ion, trimethylethylammonium ion, dimethyl diethylammonium ion, dimethylethylpropylammonium ion, methylethylpropylbutylammonium ion, ethanol ammonium ion, diethanol ammonium ion, triethanol ammonium ion, or the like; 1,8-diazabicyclo[5.4.0]undec-7-ene salts such as 1,8-diazabicyclo[5.4.0]undec-7-ene formate salt and 1,8-diazabicyclo[5.4.0]undec-7-ene p-toluenesulfonate salt; 1,5-diazabicyclo[4.3.0]-5-nonene salts such as 1,5-diazabicyclo[4.3.0]-5-nonene formate salt and 1,5-diazabicyclo[4.3.0]-5-nonene p-toluenesulfonate salt; and the like.

Examples of the N-sulfonyloxyimide compounds include N-(trifluoromethanesulfonyloxy)bicyclo [2.2.1] hept-5-ene-2,3-dicarboxyimide, N-(nonafluoro-n-butanesulfonyloxy) bicyclo [2.2.1]hept-5-ene-2,3-dicarboxyimide, N-(perfluoro-n-octanesulfonyloxy) bicyclo[2.2.1] hept-5-ene-2,3-dicarboxyimide, N-(2-bicyclo[2.2.1] hept-2-yl-1,1,2,2-tetrafluoroethanesulfonyloxy)bicyclo[2.2.1]hept-5-ene-2,3-dicarboxyimide, and the like.

Among the crosslinking accelerators [C] above, onium salt compounds are preferable; iodonium and ammonium salts are more preferable; diphenyliodonium trifluoromethanesulfonate and tetramethylammonium acetate are still more preferable.

These crosslinking accelerators [C] may be used alone or in combination of two or more. The content of the crosslinking accelerator [C] is preferably 0 parts by mass or more and 10 parts by mass or less, more preferably 0.1 parts by mass or more and 5 parts by mass or less, with respect to 100 parts by mass of the product [A]. It is possible, by controlling the content of the crosslinking accelerator [C] in the range above, to improve further the resist pattern-forming efficiency and the etching selectivity of the semiconductor device production composition.

[Other Arbitrary Components]

The semiconductor device production composition according to the embodiment of the present invention may contain other arbitrary components such as surfactants in the range that does not impair the advantageous effects of the present invention.

The surfactant is a component showing an action to improve coatability, striation, and others. Examples of the surfactants include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercial products under the trade names of KP341 (manufactured by Shin-Etsu Chemical Co., Ltd.), POLYFLOW Nos. 75 and 95 (manufactured by Kyoeisha Chemical Co., Ltd.), Eftop EF301, EF303, and EF352 (manufactured by Tohkem Products Corporation), Megafac F171 and F173 (manufactured by Dainippon Ink and Chemicals, Inc.), Fluorad FC430 and FC431 (manufactured by Sumitomo 3M Ltd.), Asahiguard AG710, Surflon S-382, SC-101, SC-102, SC-103, SC-104, SC-105, and SC-106 (manufactured by Asahi Glass Co., Ltd.); and the like.

The surfactansts may be used alone or in combination of two or more. The blending amount of the surfactant can be determined arbitrarily according to application.

[Method for Producing Semiconductor Device Production Composition]

The semiconductor device production composition according to the embodiment of the present invention can be prepared, for example, by mixing the product [A] and an organic solvent [B] and, as needed, water, a crosslinking accelerator [C], and other arbitrary components at a predetermined rate. As described above, in preparation of the semiconductor device production composition, the organic solvent [I] used in synthesis of the product [A] may be used as the organic solvent [B]. The semiconductor device production composition according to the embodiment of the present invention is prepared normally by dissolving these ingredients in the solvent and filtering the solution, for example, through a filter having a pore size of about 0.2 μm before use.

[Application of Semiconductor Device Production Composition]

Typical application of the semiconductor device production composition according to the embodiment of the present invention is not particularly limited if it is characteristic in its composition and used for production of semiconductor devices and, in particular, it can be used favorably in the multilayer resist process.

When it is used in the multilayer resist process, the semiconductor device production composition according to the embodiment of the present invention is applied directly or indirectly via a resist lower-layer film on a substrate and a film is formed on the substrate, for example, by heating (baking) the coated substrate. During the heating (baking) for forming the film, the product [A] contained in the semiconductor device production composition according to the embodiment of the present invention seems to be cross-linked three-dimensionally. The semiconductor device production composition according to the embodiment of the present invention shows volume expansion. Thus, the semiconductor device production composition according to the embodiment of the present invention is very superior in embeddability in pattern wafer.

When a common inorganic film-forming composition for multilayer resist process was used, the composition unfavorably showed curing shrinkage during heating (baking) in preparation of the film, resulting in generation of film stress. However, because the semiconductor device production composition according to the embodiment of the present invention shows volume expansion during heating (baking) in preparation of the film, the volume expansion and curing shrinkage counterbalance each other, significantly suppressing generation of film stress.

<Pattern Formation Method>

The pattern formation method according to the embodiment of the present invention is a method comprising:

(1) a step of applying the semiconductor device production composition according to the embodiment of the present invention on the top face of a substrate (hereinafter, referred to as "application step (1)"), (2) a step of forming a resist pattern on the top face of the coated film (hereinafter, referred to as "resist-patterning step (2)"), and (3) a step of forming a pattern on the substrate by dry-etching the coated film once or multiple times using the resist pattern above as mask (hereinafter, referred to as "(3) substrate-patterning step").

The pattern formation method according to the embodiment of the present invention, which uses the semiconductor device production composition described above, is superior in embeddability in pattern wafer and permits reduction of film stress and thus, gives a film superior in resist pattern-forming efficiency and etching selectivity.

In the pattern formation method according to the embodiment of the present invention, the resist-patterning step (2) may comprise a step of laminating an antireflective film on the coated film and a step of forming a resist pattern on the antireflective film laminated. Thus in the pattern formation method, it is possible to improve the resist pattern-forming efficiency additionally if a resist pattern is formed on the top face of the coated film using a resist composition or the like after an antireflective film is formed thereon.

The pattern formation method according to the embodiment of the present invention may comprise additionally (0) a step of forming a resist lower-layer film on the substrate (hereinafter, referred to as "resist lower-layer film-forming step (0)") and, in the application step (1) above, the semiconductor device production composition may be applied on the resist lower-layer film.

As the semiconductor device production composition according to the embodiment of the present invention is superior in embeddability in pattern wafer, permits reduction of film stress, and shows favorable etching selectivity to organic materials, it is possible to transfer the resist pattern by dry etching the film formed with the semiconductor device production composition and the resist lower-layer film (organic film) sequentially. Hereinafter, each step will be described.

[Resist Lower-Layer Film-Forming Step (0)]

The pattern formation method according to the embodiment of the present invention may comprise a step of forming a resist lower-layer film (organic film) on the substrate using a resist lower-layer film-forming composition upstream of the application step (1) described below. The resist lower-layer film-forming composition used may be a known composition such as NFC HM8005 (manufactured by JSR Corporation), for example. The resist lower-layer film can be prepared by applying a resist lower-layer film-forming composition on a substrate, forming a coated film, and curing the coated film by heat treatment or by UV irradiation and heat treatment. Examples of the methods of applying the resist lower-layer film-forming composition include spin coating, roll coating, dipping, and the like. The heat treatment temperature is normally 150° C. to 500° C., preferably 180° C. to 350° C. The heat treatment period is normally 30 to 1,200 seconds, preferably 45 to 600 seconds. The condition of the UV irradiation can be selected arbitrarily according, for example, to the composition of the resist lower-layer film-forming composition. The thickness of the resist lower-layer film formed is normally about 50 nm to 500 nm.

Another lower-layer film different from the resist lower-layer film may be formed additionally on the substrate surface. This another lower-layer film is a film that has an antireflective function, is superior in coated film flatness, and shows high etching resistance to fluorine-based gases such as $CF_4$. Examples of the other lower-layer films that may be used include commercial products such as NFC HM8005 (manufactured by JSR Corporation).

[Application Step (1)]

The application step (1) is a step of applying the semiconductor device production composition according to the embodiment of the present invention on the top face of a substrate. Examples of the substrates include insulation films such as of silicon oxide, silicon nitride, silicon oxynitride, and polysiloxane; and interlayer insulation films of wafers or the like coated with low-dielectric insulation film such as Black Diamond (manufactured by AMAT), Silk (Dow Chemical Company), and LKD5109 (manufactured by JSR Corporation) which are commercially available. The substrate used may be a patterned substrate with wiring grooves (trenches), plug grooves (via-holes), and others.

In the application step (1), the semiconductor device production composition according to the embodiment of the present invention may be applied on the surface of a substrate, forming a coated film, and the coated film can be cured by heat treatment or by UV irradiation and heat treatment. The method of applying the semiconductor device production composition is, for example, spin coating, roll coating, dipping, or the like. The heat treatment temperature is normally 150° C. to 500° C., preferably 180° C. to 350° C. The heat treatment period is normally 30 to 1,200 seconds, preferably 45 to 600 seconds. The condition of the UV irradiation may be selected arbitrarily according, for example, to the composition of the semiconductor device production composition. The thickness of the coated film is normally about 5 to 50 nm.

[Resist-Patterning Step (2)]

The resist-patterning step (2) is a step of forming a resist pattern on the top face of the coated film. The method of forming the resist pattern is, for example, a method of using the resist composition (A) or a nanoimprint lithography method (B). Hereinafter, each method will be described.

(Method of Using a Resist Composition (A))

When the method of using a resist composition is employed, the resist-patterning step comprises
a step of forming a resist film on the top face of the coated film with a resist composition (hereinafter, referred to as "resist film-forming step"),
a step of exposing the resist film to light (hereinafter, referred to as "exposure step") and
a step of developing the exposed resist film (hereinafter, referred to as "development step").

Hereinafter, each step will be described.

(Resist Film-Forming Step)

In the resist film-forming step, a resist film is formed on the top face of the coated film with a resist composition. The resist composition is, for example, a resist composition containing an acid-dissociating group-containing polymer and a radiation ray-sensitive acid generator, a positive resist composition containing an alkali-soluble resin and a quinonediazide-based photosensitive agent, or a negative resist composition containing an alkali-soluble resin and a cross-linking agent. A commercially available resist composition may be used as the resist composition. A conventional method, for example by spin coating, can be used as the method of applying the resist composition. When a resist composition is applied, the concentration of the resist composition is adjusted so that the resist film obtained has a desired film thickness. An antireflective film may be laminated on the coated film and then, the resist film may be formed on the laminated antireflective film. When an antireflective film is formed in preparation of the resist pattern using the resist composition, as described above, it is possible to improve the forming efficiency for the resist pattern.

The resist film can be prepared by evaporating the solvent in the coated film, for example, by prebaking (PB) the coated film prepared by application of the resist composition. The PB temperature may be altered appropriately according, for example, to the kind of the resist composition used, but is preferably 30° C. to 200° C., more preferably 50° C. to 150° C. The PB period is normally 30 to 200 seconds, preferably 45 to 120 seconds. The thickness of the resist film formed is normally 1 to 1500 nm, preferably 10 to 300 nm. Another film may be formed additionally on the surface of the resist film.

(Exposure Step)

The resist film formed is exposed to light in the exposure step. The light exposure is performed normally by irradiating a radiation ray selectively on the resist film through a photomask. The radiation ray used for the light exposure is selected properly according to the kind of the acid generator used in the resist composition, for example, from electromagnetic rays such as visible ray, ultraviolet ray, far ultraviolet ray, X ray, and γ ray; and particle beams such as electron beam, molecular beam, and ion beam. Far ultraviolet ray is preferable and KrF excimer laser beam (wavelength: 248 nm), ArF excimer laser beam (wavelength: 193 nm), F2 excimer laser beam (wavelength: 157 nm), Kr2 excimer laser beam (wavelength: 147 nm), ArKr excimer laser beam (wavelength: 134 nm), and extreme ultraviolet ray (e.g., wavelength: 13 nm) are more preferable. Alternatively, a liquid immersion exposure method can also be used. In this case, a liquid immersion upper-layer film may be formed on the resist film, using a liquid immersion upper-layer film-forming composition.

After the exposure, the substrate is preferably post-baked for improvement, for example, of the resolution, pattern profile, and developing efficiency of the resist film. The post-baking temperature may be adjusted arbitrarily according, for example, to the kind of the resist composition used, but is preferably 50° C. to 180° C., more preferably 70° C. to 150° C. The post-baking period is normally 30 to 200 seconds, preferably 45 to 120 seconds.

(Development Step)

The exposed resist film is developed in the development step. The developing solution used for development can be selected properly according to the kind of the resist composition used. In the case of a resist composition containing an acid-dissociating group-containing polymer and a radiation ray-sensitive acid generator or a positive resist composition containing an alkali-soluble resin, the developing solution used is, for example, an aqueous alkaline solution of sodium hydroxide, potassium hydroxide, sodium carbonate, sodium silicate, sodium metasilicate, ammonia, ethylamine, n-propylamine, diethylamine, di-n-propylamine, triethylamine, methyl diethylamine, dimethylethanolamine, triethanolamine, tetramethylammonium hydroxide (TMAH), tetraethylammonium hydroxide, pyrrole, piperidine, choline, 1,8-diazabicyclo[5.4.0]-7-undecene, or 1,5-diazabicyclo[4.3.0]-5-nonene, and such a developing solution gives a positive resist pattern. Among the solutions above, aqueous TMAH solution is preferable. These aqueous alkaline solutions may contain additionally a water-soluble organic solvent such as an alcohol (e.g., methanol or ethanol) and a surfactant in suitable amounts.

Alternatively in the case of a resist composition containing an acid-dissociating group-containing polymer and a radiation ray-sensitive acid generator, the developing solution used may be a solution containing an organic solvent and such a developing solution give a negative resist pattern. It is thus possible, by using a resist composition containing an acid-dissociating group-containing polymer and a developing solution containing an organic solvent, to form a finer resist pattern and thus a finer substrate pattern. Examples of the organic solvents include solvents similar to those exemplified as the organic solvents [B] for the semiconductor device production composition according to the embodiment of the present invention. Among the solvents above, ester-based solvents are preferable and butyl acetate is more preferable.

Alternatively in the case of a negative chemical amplification-type resist composition or a negative resist composition containing an alkali-soluble resin, the solvent is, for example, an aqueous alkali solution containing an inorganic alkali such as sodium hydroxide, potassium hydroxide, sodium carbonate, sodium silicate, sodium metasilicate, or ammonia water; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide, tetraethylammonium hydroxide, or choline; or a cyclic amine such as pyrrole or piperidine.

(Method of Using Nanoimprint Lithography Method (B))

When a method of using the nanoimprint lithography method (B) is used, the resist pattern formation method comprises
a step of forming a resist pattern on the coated film by a nanoimprint lithography method using a resist composition (hereinafter, referred to as "resist-patterning step by nanoimprint lithography method").

Hereinafter, this step will be described.

(Resist-Patterning Step by Nanoimprint Lithography Method)

In the present step, a resist pattern is formed on the coated film by the nanoimprint lithography method using a resist composition. More specifically, the step is a method comprising a step of forming a patterning layer on the coated film (hereinafter, referred to as "patterning layer-forming step"), a step of hydrophobilizing the surface of a mold having an inverted pattern on the surface (hereinafter, referred to as "hydrophobilizing step"), a step of pressing the surface of the hydrophobilized mold to the patterning layer (hereinafter, referred to as "pressing step"), a step of exposing the patterning layer to light as the mold is pressed (hereinafter, referred to as "exposure step"), and a step of separating the mold from the exposed patterning layer (hereinafter, referred to as "separation step").

Hereinafter, each step will be described.

(Patterning Layer-Forming Step)

A patterning layer is formed on the coated film in the patterning layer-forming step. The component constituting the patterning layer is a radiation ray-sensitive composition for nanoimprinting. The patterning layer may contain, in addition to a radiation ray-sensitive composition for nanoimprinting, a curing accelerator and others. Examples of the curing accelerators include radiation ray-sensitive curing accelerators and thermal curing accelerators. Among the compounds above, radiation ray-sensitive curing accelerators are preferable. The radiation ray-sensitive curing accelerator can be selected appropriately according to the component constituting the radiation ray-sensitive composition for nanoimprinting and examples thereof include photochemical acid generators, photochemical base generators, photosensitizers, and the like. The radiation ray-sensitive curing accelerators may be used alone or in combination of two or more.

Examples of the methods of applying the radiation ray-sensitive composition include inkjet application, dip coating, air knife coating, curtain coating, wire bar coating, gravure coating, extrusion coating, spin coating, slit scanning, and the like.

(Hydrophobilizing Step)

The surface of the mold having an inverted pattern thereon is hydrophobilized in the hydrophobilizing step. The mold should be made of a light-transmitting material. Examples of the light-transmitting materials include glass, quartz, light transparent resins such as PMMA and polycarbonate; transparent metal vapor deposition films; flexible films such as of polydimethylsiloxane; photocuring films; metal foils, and the like.

For the hydrophobilization treatment, for example, a release agent is used. Examples of the release agents include silicon-based release agents, fluorine-based release agents, polyethylene-based release agents, polypropylene-based release agents, paraffin-based release agents, montan-based release agents, carnauba-based release agents, and the like. The release agent may be used alone or in combination of two or more. Among the release agents above, silicon-based release agents are preferable. Examples of the silicon-based release agents include polydimethylsiloxanes, acrylic silicone graft polymers, acrylic siloxanes, aryl siloxanes, and the like.

(Pressing Step)

The surface of the hydrophobilized mold is pressed to the patterning layer in the pressing step. When the mold having a concavo-convex pattern is pressed to the patterning layer, the concavo-convex pattern of the mold is formed in the patterning layer. The pressure when the mold is pressed is normally 0.1 MPa to 100 MPa, preferably 0.1 MPa to 50 MPa, more preferably 0.1 MPa to 30 MPa. The pressing period is normally 1 to 600 seconds, preferably 1 to 300 seconds, more preferably 1 to 180 seconds.

(Exposure Step)

The patterning layer is exposed to light as the mold is pressed in the exposure step. When the patterning layer is exposed to light, radicals are generated from the photopolymerization initiator contained in the radiation ray-sensitive composition for nanoimprinting. The patterning layer made of the radiation ray-sensitive composition for nanoimprinting cures, as the concavo-convex pattern of the mold is transferred. After transfer of the concavo-convex pattern, the patterned layer obtained can be used, for example, as an interlayer insulation film in semiconductor elements such as LSI, system LSI, DRAM, SDRAM, RDRAM, and D-RDRAM, and as a resist film during production of semiconductor elements.

When the patterning layer is thermally curable, it may be additionally cured under heat. When it is thermally cured, the heating atmosphere, the heating temperature, and others are not particularly limited. For example, the patterning layer can be heated at 40° C. to 200° C. under inactive atmosphere or under reduced pressure. The heating can be performed, for example, using a hot plate, an oven, or a furnace.

(Separation Step)

The mold is separated from the exposed patterning layer in the present step. The separation method is not particularly limited. For example, the mold may be separated from the substrate, as the substrate is fixed and the mold moved from the substrate, as the mold is fixed and the substrate moved from the mold, or as both of them are pulled in the opposite direction.

[Substrate-Patterning Step (3)]

In the substrate-patterning step (3), a pattern is formed on the substrate by dry-etching the coated film once or multiple times, using the resist pattern as mask. If a resist lower-layer film described below is formed, the coated film, the resist lower-layer film, and the substrate to be processed are dry-etched sequentially, using the resist pattern as mask, to form a pattern. The dry etching can be performed using a known dry-etching apparatus. The source gas used in the dry etching may vary according to the elemental composition of the material to be etched, but examples of the usable gases include oxygen atom-containing gases such as $O_2$, CO, and $CO_2$; inert gases such as He, $N_2$, and Ar; chlorine-based gases such as $Cl_2$ and $BCl_3$; fluorine-based gases such as $CHF_3$ and $CF_4$; gases such as $H_2$ and $NH_3$, and the like. These gases may be used as mixed.

EXAMPLES

Hereinafter, the present invention will be described more in detail with reference to Examples. The Examples described below are only typical examples of the present invention and the present invention shall not be construed narrower in scope.

<Synthesis of Product [A]>

Metal compounds used in synthesis of the product [A] are as follows:

M-1: titanium (IV) diisopropoxybis(2,4-pentanedionate) (75 mass % 2-propanol solution)
M-2: aluminum (III) diisopropoxyethyl acetoacetate
M-3: zirconium (IV) di-n-butoxide bis(2,4-pentanedionate) (60 mass % butanol solution)
M-4: tantalum (V) tetraethoxy(2,4-pentanedionate)
M-5: bis(cyclopentadienyl)tungsten (IV) dichloride

Preparative Example 1

The compound above (M-1) (10.0 g, complex mass: 7.5 g, 20.6 mmol) was dissolved in propylene glycol monoethyl ether (65.0 g). After thorough agitation, 30% hydrogen peroxide solution [0.75 g, (0.23 g, 6.6 mmol as hydrogen peroxide)] was added dropwise to the solution at room temperature over 10 minutes. After reaction at room temperature for 1 hour, citric acid (7.9 g, 41.2 mmol) was added thereto and the mixture was agitated at room temperature for 2 hours, to give a solution (S-1).

Preparative Example 2

The compound above (M-2) (4.9 g, 18 mmol) was dissolved in 2-propanol (40.2 g). After thorough agitation, a liquid mixture of maleic anhydride (1.8 g, 18 mmol) and water (7.2 g) was added to the solution at room temperature and the mixture was agitated for 30 minutes. Then, 30% hydrogen peroxide solution [1.02 g, (0.31 g, 9.0 mmol as hydrogen peroxide)] was added dropwise at room temperature over 10 minutes. After reaction at room temperature for 3 hours, propylene glycol monomethyl ether acetate (42.2 g) was added to the solution, to give a solution (S-2).

Preparative Example 3

The compound above (M-3) (16.7 g, complex mass: 10.0 g, 23 mmol) was dissolved in 1-butanol (99.6 g). After thorough agitation, 30% hydrogen peroxide solution [1.3 g, (0.39 g, 11.5 mmol as hydrogen peroxide)] was added dropwise to the solution at room temperature over 10 minutes. After reaction at 60° C. for 1 hour, the mixture was cooled to room temperature; diethylene glycol (1.2 g, 11.5 mmol) was added thereto and the mixture was agitated at room temperature for 2 hours, to give a solution (S-3).

Preparative Example 4

The compound above (M-4) (4.6 g, 10 mmol) was dissolved in dibutyl ether (44.32 g). After thorough agitation, 30% hydrogen peroxide solution [1.1 g, (0.34 g, 10 mmol as hydrogen peroxide)] was added dropwise to the solution at room temperature over 10 minutes. After reaction at 60° C. for 1 hour, the mixture was cooled to room temperature, ethylenediamine (0.30 g, 5.0 mmol) was added thereto and the mixture was agitated at room temperature for 1 hour, to give a solution (S-4).

Preparative Example 5

The compound above (M-5) (3.8 g, 10 mmol) was dissolved in ethyl lactate (44.42 g). After thorough agitation, 30% hydrogen peroxide solution [0.57 g (0.17 g, 5.0 mmol as hydrogen peroxide)] was added dropwise to the solution at room temperature over 10 minutes. After reaction at room temperature for 2 hours, lactic acid (0.90 g, 10 mmol) was added thereto and the mixture was agitated at room temperature for 1 hour, to give a solution (S-5).

Preparative Example 6

A solution (S-6) was prepared in a manner similar to Preparative Example 1, except that no citric acid was added.

Comparative Preparative Example 1

A solution (CS-1) was prepared in a manner similar to Preparative Example 1, except that 30% hydrogen peroxide solution (0.75 g) added therein was replaced with pure water (0.52 g).

<Preparation of Semiconductor Device Production Composition>

The crosslinking accelerators [C] used in preparation of the semiconductor device production compositions are as follows:

C-1: diphenyliodonium trifluoromethanesulfonate
C-2: tetramethylammonium acetate

Example 1

The solution (S-1) of product [A] obtained above was filtered through a filter having a pore size of 0.2 μm, to give a semiconductor device production composition (J-1). When the film thickness needed to be thinner, the solution was diluted properly with the solvent used in the Preparative Example (higher-boiling solvent if multiple solvents were used) and filtered through a filter having a pore size of 0.2 μm.

Examples 2 to 6 and Comparative Example 1

Semiconductor device production compositions (J-2) to (J-6) and (CJ-1) were prepared in a manner similar to Example 1, except that a kind of the solution of product [A] shown in Table 1 below and, as needed, a kind and amount of the crosslinking accelerator [C] shown in Table 1 were used. "–" indicates that the corresponding component was not used. The amount of the crosslinking accelerator [C] used is that (part by mass) with respect to 100 parts by mass of the solution of product [A].

<Evaluation>

Properties of the semiconductor device production compositions thus prepared were examined according to the methods described below. Results are summarized in the following Table 1.

[Embeddability in Patterned Substrate]

Each of the semiconductor device production compositions above was applied dropwise on a silicon wafer as substrate carrying a 45 nm line/space pattern (aspect ratio: 2 to 10) and the substrate was rotated at 1,500 rpm for 30 seconds, forming a coated film (unheated film). The coated film was baked on a hot plate at 250° C. for 60 seconds. The top face and the cross section of the coated film were then observed under SEM for evaluation of the film embeddability into the line/space pattern. The symbols in Table 1 indicate the following results:

A (very favorable): no unfavorable embedding was observed under SEM even at an aspect ratio of 5 or more.

B (favorable): no unfavorable embedding was observed under SEM even at an aspect ratio in the range of 2 to 5, although there was unfavorable embedding observed at an aspect ratio of 5 or more.

C (unfavorable): unfavorable embedding was observed under SEM even at an aspect ratio in the range of 2 to 5.

[Stress of Coated Film]

A semiconductor device production composition was applied on an 8-inch silicon wafer; the substrate was rotated at 1,500 rpm for 30 seconds; and the coated film obtained was baked on a hot plate at 250° C. for 60 seconds. Bending of the wafer then was determined on FLEX-2320 thin film stress analyzer of KLA-Tencor Corporation and the stress applied to the film was analyzed from the bending above and additionally the film thickness of the film obtained from the semiconductor device production composition. In Table 1, the symbol "+" indicates shrinking stress (concave), while the symbol "−" indicates expanding stress (convex) in the film horizontal direction.

[Resist Pattern-Forming Efficiency]

(In the Case of Resist Composition-Aqueous Alkaline Solution Development)

A resist lower-layer film-forming composition ("NFC HM8005" manufactured by JSR Corporation) was applied onto a silicon wafer as substrate by a spin coater and dried on a hot plate at 250° C. for 60 seconds, to give a resist lower-layer film having a film thickness of 300 nm. A semiconductor device production composition was applied onto the formed resist lower-layer film by spin coater and baked on a hot plate at 250° C. for 60 seconds, to give a coated film having a film thickness of 20 nm. A resist composition ("ARX2014J" manufactured by JSR Corporation) was applied onto the formed coated film and dried at 90° C. for 60 seconds, to give a resist film having a film thickness of 100 nm. A liquid immersion upper-layer film-forming composition ("NFC TCX091-7" manufactured by JSR Corporation) was applied onto the formed resist film and dried at 90° C. for 60 seconds, to give a liquid immersion upper-layer film having a film thickness of 30 nm. The substrate was then exposed to light in an ArF excimer laser irradiation apparatus ("S610C" manufactured by Nikon Corporation) at an exposure of 16 mJ/cm$^2$ through a photomask for a line and space patterning that gives lines and spaces having a width of 50 nm by the immersion exposure method and the resulting resist film-carrying substrate was heated at 115° C. for 60 seconds. The substrate was then developed, using aqueous 2.38 mass % tetramethylammonium hydroxide solution as developing solution, for 30 seconds, to form a 50 nm 1L/1S resist pattern. The resist pattern formed was observed under a scanning electron microscope (Hitachi High-Technologies Corporation). The resist pattern-forming efficiency was indicated by "A (favorable)" when the bottom shape of the 50 nm line and space resist pattern is vertical and by "B (unfavorable)" when it is not vertical. The coated film and the substrate was dry etched, using the formed resist pattern as mask, in a dry etching apparatus ("Telius SCCM" manufactured by Tokyo Electron Ltd.) for transfer of the pattern.

(In the Case of Resist Composition-Organic Solvent Development)

A resist lower-layer film-forming composition ("NFC HM8005" manufactured by JSR Corporation) was applied onto a silicon wafer as substrate by a spin coater and dried on a hot plate at 250° C. for 60 seconds, to form a resist lower layer having a film thickness of 300 nm. A semiconductor device production composition was applied on the formed resist lower-layer film by a spin coater and baked on a hot plate at 250° C. for 60 seconds, to form a coated film having a film thickness of 20 nm. A resist composition ("ARX2014J" manufactured by JSR Corporation) was applied on the formed coated film and dried at 90° C. for 60 seconds, to form a resist film having a film thickness of 100 nm. A liquid immersion upper-layer film-forming composition ("NFC TCX091-7" manufactured by JSR Corporation) was applied onto the formed resist film and dried at 90° C. for 60 seconds, to form a liquid immersion upper-layer film having a film thickness of 30 nm. The substrate was then exposed to light in an ArF excimer laser irradiation apparatus ("S610C" manufactured by Nikon Corporation) at an exposure of 16 mJ/cm$^2$ through a photomask for a line and space patterning that gives lines and spaces having a width of 40 nm by the immersion exposure method and the resulting resist film-carrying substrate was heated at 115° C. for 60 seconds. The substrate was then paddle-developed, using butyl acetate as developing solution, for 30 seconds and rinsed with methyl isobutyl carbinol (MIBC). The substrate was spin-dried at 2,000 rpm for 15 seconds, to give a 40 nm 1L/1S resist pattern. The formed resist pattern was observed under a scanning electron microscope (manufactured by Hitachi High-Technologies Corporation). The resist pattern-forming efficiency was indicated by "A (favorable)" when the bottom shape of the 40 nm line and space resist pattern is vertical and by "B (unfavorable)" when it is not vertical. The coated film and the substrate were dry etched, using the formed resist pattern as mask, in a dry etching apparatus "Telius SCCM" manufactured by Tokyo Electron Ltd.) for transfer of the pattern.

[Etching Selectivity]

The coated film formed using the semiconductor device production composition was etched in the etching apparatus above by the following two methods and its etching selectivity was examined.

(1) Etching condition for resist lower-layer film
Chamber pressure: 12 Pa
$O_2$ gas flow rate: 300 sccm
$N_2$ gas flow rate: 100 sccm
Upper RF power: 800 W
Lower RF power: 300 W (2) Etching condition for silicon dioxide film
Chamber pressure: 12 Pa
$CF_4$ gas flow rate: 500 sccm
$N_2$ gas flow rate: 200 sccm
Ar gas flow rate: 200 sccm
Upper RF power: 500 W
Lower RF power: 300 W The resist lower-layer film (NFC HM8005) and the silicon dioxide film above were etched under respective conditions (1) and (2) for a period giving an etching depth of 100 nm.

When the difference between the initial film thickness and the post-etching film thickness is less than 10 nm under the etching condition (1) or less than 30 nm under the etching condition (2), the etching selectivity was indicated by "A (favorable)" and, when it is 10 nm or more under the etching condition (1) or 30 nm or more under the etching condition (2), the etching selectively was indicated by "B (unfavorable)".

When the etching selectivity is judged to be favorable, the coated film formed from the semiconductor device production composition can function favorably as a mask film during film processing.

TABLE 1

| | Product [A] solution (100 parts by mass) | Crosslinking accelerator | | Film stress (MPa) | Evaluation | | | | |
|---|---|---|---|---|---|---|---|---|---|
| | | | | | | Resist pattern-forming efficiency | | Etching resistance | |
| | | Kind | Amount (parts by mass) | | Embeddability in patterned substrate | Aqueous alkaline solution development | Organic solvent development | Resist lower-layer film | Silicon dioxide film |
| Example 1 | S-1 | — | — | 20 | A | A | A | A | A |
| Example 2 | S-2 | C-1 | 0.025 | 25 | A | A | A | A | A |
| Example 3 | S-3 | — | — | 18 | A | A | A | A | A |
| Example 4 | S-4 | C-2 | 0.05 | 28 | A | A | A | A | A |
| Example 5 | S-5 | — | — | −2 | A | A | A | A | B |
| Example 6 | S-6 | — | — | 77 | B | A | A | A | A |
| Comparative Example 1 | CS-1 | — | — | 105 | C | A | A | A | A |

As shown in Table 1, the semiconductor device production compositions of Examples 1 to 5 were shown to be embeddable even into a fine wafer line/space pattern. They were also found to have a smaller post-baking film stress. The coated films formed were also found to be superior in etching selectivity and also in resist pattern-forming efficiency.

The etching resistance of the coated film of Example 5 was unfavorable under the silicon dioxide film-etching condition. It is probably because the tungsten oxide film obtained after baking is easily etched under the silicon dioxide film-etching condition. The results above suggest that the semiconductor device production composition of Example 5 is preferably used as the mask for use in etching the resist lower-layer film.

In Example 6, no crosslinkable organic group was used during synthesis. The embeddability of the coated film into fine wafer line/space pattern was smaller than those of Examples 1 to 5 but higher than that of Comparative Example 1. The film stress of the baked film was also larger to the shrinkage side, compared to those of Examples 1 to 5, but smaller than that of Comparative Example 1. The results suggest that it is preferable to use hydrogen peroxide and additionally a crosslinkable organic group in synthesis of the product [A] contained in the semiconductor device production composition according to the embodiment of the present invention.

Alternatively in Comparative Example 1, no hydrogen peroxide was used during synthesis. The embeddability of the coated film into fine wafer line/space pattern was unfavorable and the film stress of the baked film was also found to be larger to the shrinkage side. The results above suggest that it is essential, for favorable embeddability of the coated film into a fine wafer line/space pattern and for reduction of film stress, to use hydrogen peroxide in synthesis of the product [A] contained in the semiconductor device production composition according to the embodiment of the present invention.

The embodiment of the present invention provides a semiconductor device production composition that is superior in embeddability into the fine patterns of wafer during application and spin coating thereof, has smaller film stress after baking, and is also superior in resist pattern-forming efficiency and etching selectivity, and a pattern formation method using the same. The semiconductor device production composition can be used quite favorably particularly in the future in the process for production of 3D-structured devices that demand embedding of a multilayer material that has a high etching resistance into fine patterns.

Obviously, numerous modifications and variations of the present invention are possible in light of the above teachings. It is therefore to be understood that within the scope of the appended claims, the invention may be practiced otherwise than as specifically described herein.

The invention claimed is:

1. A semiconductor device production composition, comprising:
    a product obtained by mixing a metal compound and a compound represented by Formula (1) in a first organic solvent;
    a second organic solvent; and
    water:

$$R\text{—}O\text{—}O\text{—}R' \quad (1)$$

wherein, in Formula (1), R and R' each represent a hydrogen atom, and
    wherein a weight of the second organic solvent is larger than a weight of the water.

2. The semiconductor device production composition according to claim 1, wherein the product is prepared by further mixing a compound represented by Formula (2):

$$R^1\text{—}(X)_n \quad (2)$$

wherein, in Formula (2), $R^1$ represents a n-valent organic group; X represents —OH, —COOH, —NCO, or —NR$^a$R$^b$; R$_a$ and R$^b$ each independently represent a hydrogen atom or a monovalent organic group; n is an integer of 2 to 4; and each X is the same as or different from each other.

3. The semiconductor device production composition according to claim 1, wherein the metal compound is represented by Formula (3):

$$[ML_aX_b] \quad (3)$$

wherein, in Formula (3), M represents a titanium atom, an aluminum atom, a zirconium atom, a tantalum atom, a hafnium atom, a molybdenum atom, or a tungsten atom; L represents a multidentate ligand; a is an integer of 1 to 3; when a is 2 or more, each L is the same as or different from each other; X represents a halogen ligand, a hydroxo ligand, a carboxy ligand, an alkoxy ligand, a carboxylate ligand, or an amide ligand; b is an integer of 2 to 6; each X is the same as or different form each other; and a+b is 7 or less.

4. The semiconductor device production composition according to claim 1, wherein the first organic solvent is the same as the second organic solvent.

5. The semiconductor device production composition according to claim 1, for use in a multilayer resist process.

6. The semiconductor device production composition according to claim 2, wherein the metal compound is represented by Formula (3):

$$[ML_aX_b] \qquad (3)$$

wherein, in Formula (3), M represents a titanium atom, an aluminum atom, a zirconium atom, a tantalum atom, a hafnium atom, a molybdenum atom, or a tungsten atom; L represents a multidentate ligand; a is an integer of 1 to 3; when a is 2 or more, each L is the same as or different from each other; X represents a halogen ligand, a hydroxo ligand, a carboxy ligand, an alkoxy ligand, a carboxylate ligand, or an amide ligand; b is an integer of 2 to 6; each X is the same as or different form each other; and a+b is 7 or less.

7. A pattern formation method, comprising:
applying a semiconductor device production composition onto a top face of a substrate to form a coated film on the top face of the substrate;
forming a resist pattern on a top face of the coated film; and
forming a pattern on the substrate by dry-etching the coated film one or more times, using the resist pattern as a mask,
wherein the semiconductor device production composition comprises:
a product obtained by mixing a metal compound and a compound represented by Formula (1) in a first organic solvent; and
a second organic solvent:

$$R\text{—}O\text{—}O\text{—}R' \qquad (1)$$

wherein, in Formula (1), R and R' each independently represent a hydrogen atom, a linear or cyclic alkyl group having a carbon number of 2 to 20, a linear or cyclic alkylcarbonyl group having a carbon number of 2 to 20, an aryl group having a carbon number of 6 to 20, or an aryloxy group having a carbon number of 6 to 20, and part of the hydrogen atoms in the cyclic alkyl, cyclic alkylcarbonyl, aryl, or aryloxy group are unsubstituted or substituted with substituent groups.

8. The pattern formation method according to claim 7, wherein the forming of the resist pattern comprises:
forming an antireflective film on the coated film; and
forming the resist pattern on the antireflective film laminated.

9. The pattern formation method according to claim 7, further comprising:
forming a resist lower-layer film on the substrate, wherein the semiconductor device production composition is applied on the resist lower-layer film.

10. The pattern formation method according to claim 7, wherein the product is prepared by further mixing a compound represented by Formula (2):

$$R^1\text{—}(X)_n \qquad (2)$$

wherein, in Formula (2), $R^1$ represents a n-valent organic group; X represents —OH, —COOH, —NCO, or —$NR^aR^b$; $R^a$ and $R^b$ each independently represent a hydrogen atom or a monovalent organic group; n is an integer of 2 to 4; and each X is the same as or different from each other.

11. The pattern formation method according to claim 7, wherein the metal compound is represented by Formula (3):

$$[ML_aX_b] \qquad (3)$$

wherein, in Formula (3), M represents a titanium atom, an aluminum atom, a zirconium atom, a tantalum atom, a hafnium atom, a molybdenum atom, or a tungsten atom; L represents a multidentate ligand; a is an integer of 1 to 3; when a is 2 or more, each L is the same as or different from each other; X represents a halogen ligand, a hydroxo ligand, a carboxy ligand, an alkoxy ligand, a carboxylate ligand, or an amide ligand; b is an integer of 2 to 6; each X is the same as or different form each other; and a+b is 7 or less.

12. The pattern formation method according to claim 7, wherein in Formula (1), R and R' each represent a hydrogen atom.

13. The pattern formation method according to claim 7, wherein comprising water, wherein a weight of the second organic solvent is larger than a weight of the water.

14. The pattern formation method according to claim 7, wherein the first organic solvent is the same as the second organic solvent.

* * * * *